(12) United States Patent
Goodner et al.

(10) Patent No.: US 7,365,375 B2
(45) Date of Patent: Apr. 29, 2008

(54) ORGANIC-FRAMEWORK ZEOLITE INTERLAYER DIELECTRICS

(75) Inventors: Michael D. Goodner, Hillsboro, OR (US); Mansour Moinpour, San Jose, CA (US); Grant M. Kloster, Lake Oswego, OR (US); Boyan Boyanov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 339 days.

(21) Appl. No.: 11/089,954

(22) Filed: Mar. 25, 2005

(65) Prior Publication Data
US 2006/0214303 A1  Sep. 28, 2006

(51) Int. Cl.
*H01L 29/739* (2006.01)
*H01L 31/00* (2006.01)

(52) U.S. Cl. .................. 257/200; 136/256; 252/77; 252/572

(58) Field of Classification Search ................ 136/256; 252/73, 77, 572; 257/200
See application file for complete search history.

(56) References Cited

U.S. PATENT DOCUMENTS 6,630,696 B2 * 10/2003 Yan et al. .................. 257/200

OTHER PUBLICATIONS

U.S. Appl. No. 10/956,794, filed Sep. 30, 2004, Shankar et al.
U.S. Appl. No. 10/995,925, filed Nov. 22, 2004, Boyanov et al.
Baerlocher, CH. et al., *Atlas of Zeolite Framework Types*, Fifth Revised Edition, Elsevier Publishing, Feb. 2001, 19 pages.
Wang, Z. et al., *Pure-Silica Zeolite Low-k Dielectric Thin Films*, Advanced Materials, vol. 13, No. 10, May 17, 2001, pp. 746-749.
Yamamoto, K. et al., *Organic-Inorganic Hybrid Zeolites Containing Organic Frameworks*, Science, vol. 300, Apr. 18, 2003, pp. 470-472.

* cited by examiner

*Primary Examiner*—Fernando L. Toledo

(57) ABSTRACT

An organic-framework zeolite interlayer dielectric is disclosed. The interlayer dielectric's resistance to chemical attack, its dielectric constant, its mechanical strength, or combinations thereof can be tailored by (1) varying the ratio of carbon-to-oxygen in the organic-framework zeolite, (2) by including tetravalent atoms other than silicon at tetrahedral sites in the organic-framework zeolite, or (3) by including combinations of pentavalent/trivalent atoms at tetrahedral sites in the organic-framework zeolite.

11 Claims, 5 Drawing Sheets

ORGANIC-FRAMEWORK ZEOLITE INTERLAYER DIELECTRICS

FIELD OF THE INVENTION

Embodiments of the present invention relate generally to semiconductor technology and more specifically to semiconductor device interlayer dielectrics.

BACKGROUND OF THE INVENTION

The reduction of semiconductor device dimensions is increasing the density of semiconductor circuitry to a point where interconnect line-to-line capacitance is impacting the speed (due to propagation delay) and reliability (due to crosstalk noise) of semiconductor devices. Manufacturers are addressing this is by incorporating changes to semiconductor device fabrication processes. One change includes conversion of the interlayer dielectric (ILD) from silicon dioxide-based ($SiO_2$-based) materials (e.g. conventional $SiO_2$, which has a dielectric constant of approximately 3.9-4.2 and fluorinated silicon dioxide, which has a dielectric constant of approximately 3.5) to lower dielectric constant (low-k) materials. Decreasing the dielectric constant of the ILD decreases line-to-line capacitance and its associated effects.

Carbon-doped oxides (CDOs) are one class of materials being investigated to replace $SiO_2$-based ILDs. CDOs typically have lower dielectric constants than $SiO_2$-based materials (i.e. some can have dielectric constants of 2.0 and below). However, other properties can make their integration problematic. For example, the modulus of elasticity (i.e., mechanical strength) of CDOs is significantly lower than that of $SiO_2$-based materials. Chemically vapor deposited (CVD) $SiO_2$ has a modulus of elasticity of approximately 60-70 gigapascals (GPa). Carbon-doped oxides on the other hand, typically have a modulus of elasticity less than 15 GPa. Low modulus of elasticity materials are more susceptible to deformation and damage when subject to compressive, tensile, and sheer stresses. The inability to withstand stresses during, for example, chemical mechanical planarization, die singulation, wafer probe, wire bond, die attach, etc., limits the attractiveness of CDOs because in addition to the CDO process itself, expensive and time consuming process/retooling changes must also be made at other processing stages to accommodate the presence of the CDO.

Another class of materials being considered for use as an ILD includes that of zeolites. Zeolites are highly ordered porous structures that typically have pore diameters less than approximately two nanometers. Because of their ordered nature, they are mechanically stronger than carbon-doped oxides. And, because of their porous nature, they can have lower dielectric constants than that of conventional $SiO_2$-based materials. The use of pure silica zeolites as an ILD material is known. For example, U.S. Pat. No. 6,630,696 to Yan describes an insulation material comprising a pure silica zeolite (i.e., silicalite). Pure silica zeolites are reported to have a modulus of elasticity of 30-40 gigapascals (GPa), an experimentally demonstrated dielectric constant as low as 1.8, and a theoretical dielectric constant of approximately 1.6.

Figure 1:
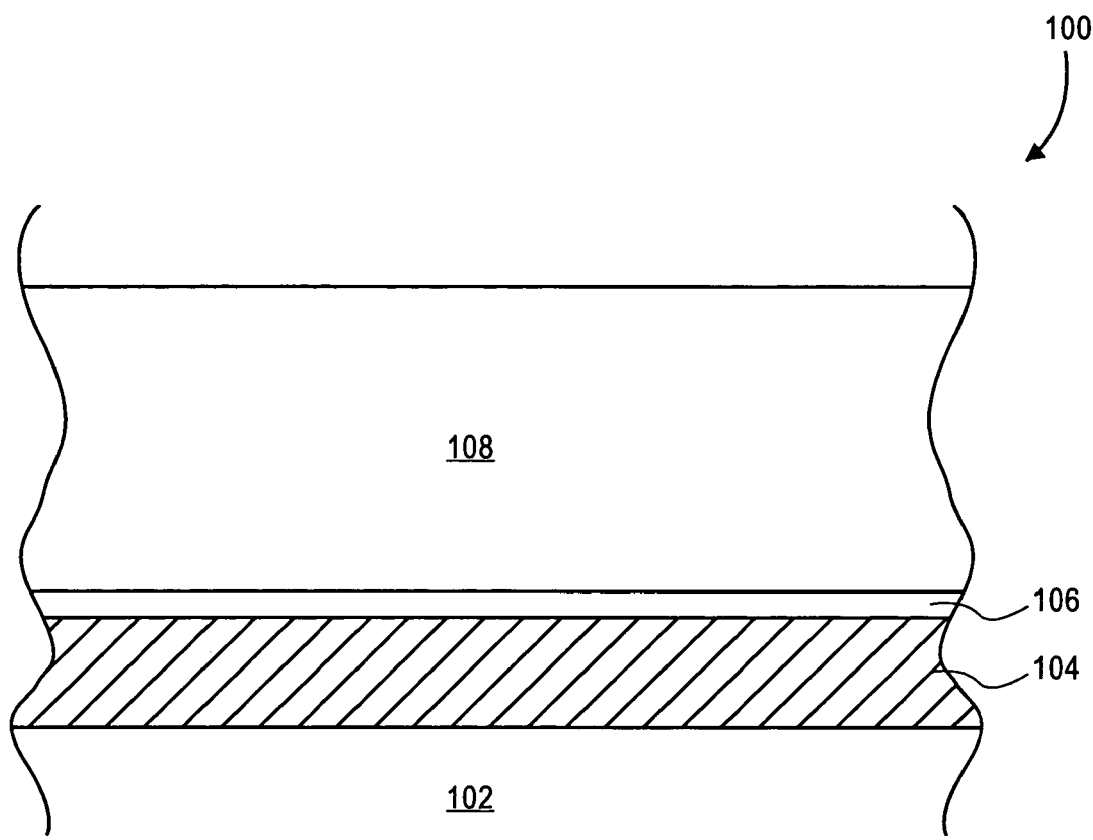
FIG. 1 illustrates a cross-sectional view of a partially fabricated semiconductor device that includes an interlayer dielectric.

It will be appreciated that for simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a composition for an ILD is disclosed. Reference is made to the accompanying drawings within which are shown, by way of illustration, exemplary embodiments of the present invention and its use in semiconductor manufacturing. It is to be understood that other structural compositions and uses may exist that do not depart from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In accordance with one or more of the embodiments herein, low-k ILDs and their method of formation are disclosed. In one embodiment, an ILD is formed from an organic-framework zeolite having similar or better dielectric properties, mechanical properties, or both dielectric and mechanical properties than those of pure silica zeolites. In addition to having a dielectric constant that is lower than that of $SiO_2$-based materials and having a modulus of elasticity that is higher than that of CDOs, the organic-framework zeolite disclosed herein is resistant to chemical attack during clean and etching operations. This resistance can be tailored by changing the zeolite's oxygen-to-methylene ($O:CH_2$) ratio. In an alternative embodiment, tetravalent metal atoms (other than silicon) can be incorporated into the organic-framework zeolite to alter mechanical and electrical characteristics of the ILD. In another embodiment, concomitant trivalent and pentavalent metal atoms can be incorporated within the organic-framework zeolite. These embodiments and variations thereof may be better understood with respect to FIGS. 1-9.

Figure 3:
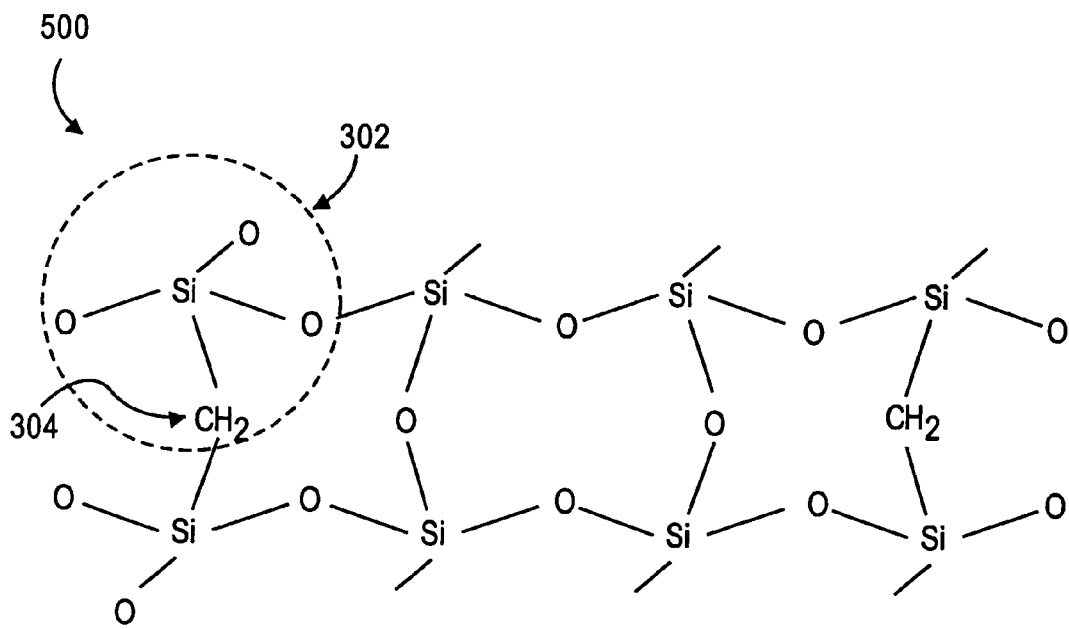
FIG. 3 illustrates an organic-framework zeolite showing partial methylene substitution.
Figure 4:
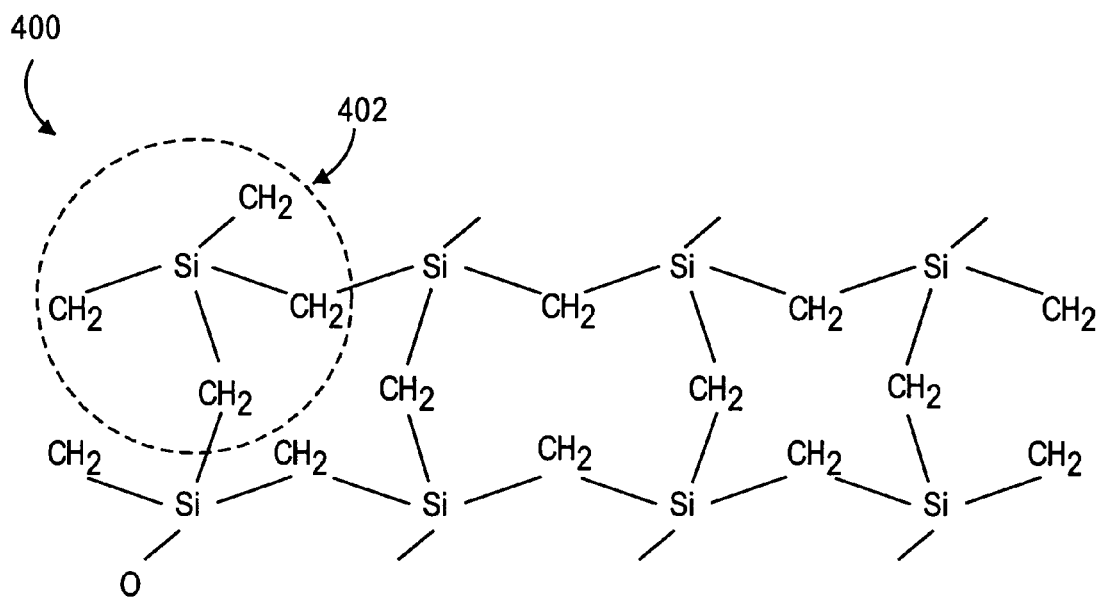
FIG. 4 illustrates an organic-framework zeolite showing full methylene substitution.
Figure 5:
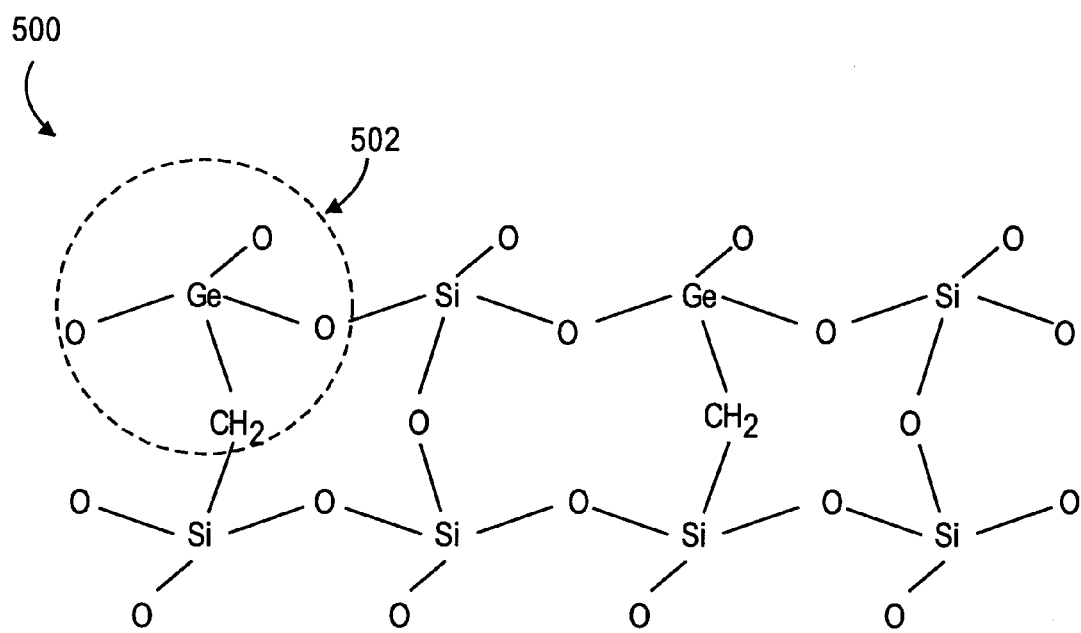
FIG. 5 illustrates an organic-framework zeolite showing partial methylene substitution and partial germanium substitution.

FIGS. 1 and 6-9 illustrate, in cross-sectional diagrams, formation of an interconnect within an ILD in accordance with an embodiment of the present invention. FIGS. 3-5 illustrate various organic-framework zeolite compositions that can be used to form the ILD.

Shown in FIG. 1 is an illustration of a partially fabricated semiconductor device 100. The semiconductor device 100 includes one or more base layers 102. Under the base layers 102 is a substrate (not shown) which is typically a semiconductor wafer. The substrate's material typically includes silicon, silicon germanium, gallium arsenide or other III-V compounds, silicon carbide, silicon on insulator (SOI), or the like.

The multi-layered region (base layers) 102 typically includes a combination of dielectric, semiconductive, and/or conductive layers that have been photolithographically patterned and etched to form semiconductor device structures over, on, or within the substrate. For example, region 102 may include one or more of various dielectric layers such as silicon nitride, silicon dioxide, tetraethylorthosilicate (TEOS), borophosphosilicate glass (BPSG), spin on glass (SOG), low-k materials, high-k materials, or the like. The region 102 may also contain semiconductive features that include one or more of epitaxial silicon, polysilicon, amorphous silicon, doped polysilicon, or the like. In addition, the multi-layer region 102 can also include conductive features or metallic layers that include one or more of refractory silicides, refractory metals, aluminum, copper, alloys of these materials, conductive nitrides, conductive oxides, or the like.

Overlying region 102 is a conductive structure 104. The conductive structure 104 can be an interconnect, a conductive plug, or the like. The conductive structure 104 can include adhesion layers, barrier layers, seed layers and conductive fill materials formed from materials that include refractory metals, silicides, aluminum, copper, conductive nitrides, conductive oxides, alloys of these materials, or the like. Conductive structure 104 may be electrically connected to some portions of region 102 and electrically insulated from other portions of region 102.

Overlying the conductive structure 104 is an optional etch stop layer (ESL) 106. The etch stop layer 106 typically, but not necessarily, includes one or more of silicon nitride, silicon oxynitride, or a silicon-rich-silicon-nitride. The etch stop layer can be deposited using chemical vapor deposition (CVD) or plasma-enhanced chemical vapor deposition (PECVD).

Figure 2:
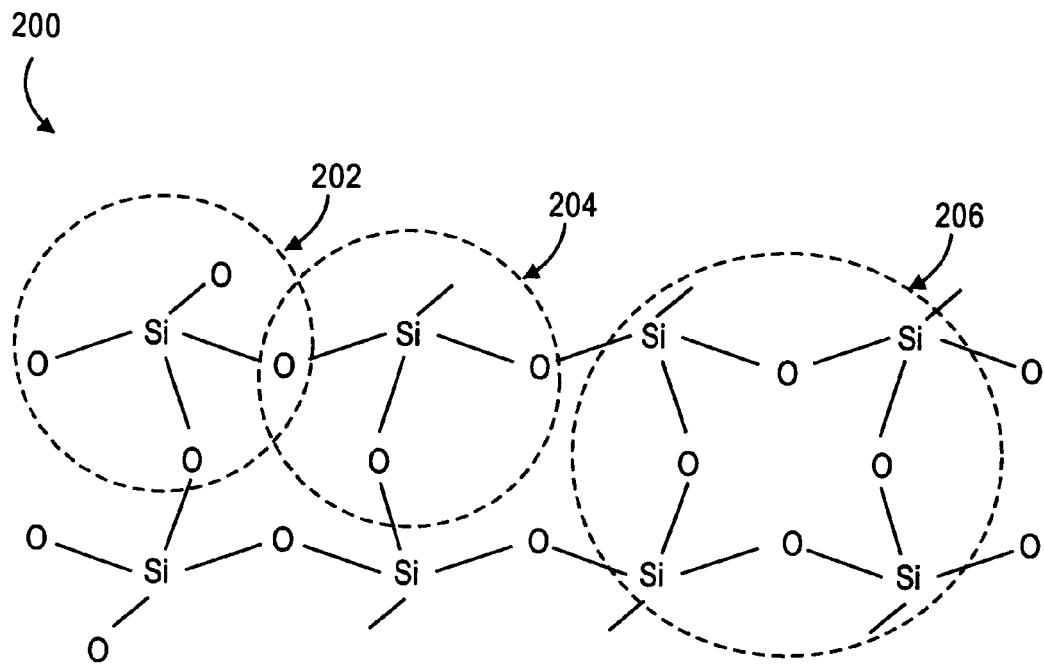
FIG. 2 illustrates a pure silica zeolite framework.

Over the etch stop layer 106 is an interlayer dielectric (ILD) 108. In accordance with one embodiment, the ILD 108 is an organic-framework zeolite. Specific discussion of organic-framework zeolites will begin with FIG. 3. "Zeolites," in general, are a class of compounds having highly ordered porous structures with pore diameters typically less than approximately 2 nanometers. The ordered nature of the pores contributes to making zeolites mechanically strong. Zeolites typically include atoms such as silicon (Si), oxygen (O), and in some instances, other atoms such as aluminum (Al). "Pure silica zeolites" (e.g., silicalite) on the other hand, comprise only silicon and oxygen. Pure silica zeolites can have dielectric constants that range from approximately 1.8-3.3 (depending on the defect density). FIG. 2 depicts, in two-dimensions, an example of a pure silica zeolite framework 200. The primary building unit (PBU) of the pure silica zeolite framework 200 is indicated by unit 202. In this example, "Si" represents tetrahedral sites (i.e., a location within the zeolite molecular framework where an atom may form four bonds, also known as a "T-atom") where silicon atoms reside and "O" represents relative positional sites where the oxygen atoms reside. As shown in FIG. 2, other PBUs 204 can be linked to the PBU 202. By linking multiple PBUs together, a secondary building unit (SBU), such as SBU 206 can be formed.

Turning now to FIG. 3, in accordance with one embodiment of the present invention an "organic-framework zeolite" 300 is illustrated. The organic framework zeolite can be used to form the ILD 108 of FIG. 1. The PBU of the organic-framework zeolite, here indicated by the unit 302, includes silicon, oxygen, and a carbon-containing group (e.g. methylene). In FIG. 3, "Si" represents tetrahedral sites where silicon atoms can reside, "O" represents lattice sites where the oxygen atoms can reside, and $CH_2$ represents lattice sites where a carbon-containing group can reside. One of ordinary skill appreciates that the carbon-containing group could alternatively reside in one of the other oxygen-occupied sites.

In addition to having a relatively high mechanical strength and low dielectric constant, the organic-framework zeolite disclosed herein has the added benefit of increased resistance to etch/clean damage that results from exposure to fluorine-containing chemicals such as hydrofluoric acid (HF), fluorine-containing plasmas, and the like. In other words, because the Si—C bond is not as susceptible to attack by HF (and other chemicals or fluorine-containing plasmas) as the Si—O bond, its presence makes the framework 300 more robust with respect to wet and dry etch and cleaning processes.

The number of methylene (or other carbon-containing) groups in the organic-framework zeolite lattice can be increased (or decreased) in order to modulate the effects that the carbon-containing group(s) have on the ILD's properties. For example, turning to FIG. 4, in accordance with one embodiment, a fully substituted organic-framework zeolite 400 is illustrated. The PBU of the zeolite is indicated by unit 402. In this embodiment, "Si" represents tetrahedral sites where silicon atoms can reside and "$CH_2$" represents lattice sites where methylene groups can reside. Unlike the organic-framework zeolite shown in FIG. 3, methylene groups here have been fully incorporated into the framework by superseding all lattice oxygen atoms. It is believed that increasing the number of carbon-containing groups correspondingly increases the ILD's resistance to chemical attack and reduces its dielectric constant.

In addition to PBUs that include one and four methylene (or other carbon-containing) groups (as shown in FIGS. 3 and 4, respectively), substitutions can alternatively include two or three methylene groups. Modulating the PBU's ratio of oxygen atoms to methylene units provides added flexibility with respect to optimizing material properties such as mechanical strength, dielectric constant, and dry and wet etch rates. In this way, the lattice can be engineered to include oxygen and methylene in ratios that allow the ILD to take advantage of their individual and collective benefits and functionalities.

FIG. 5 illustrates an alternative embodiment of an organic-framework zeolite 500 that includes a germanium atom positioned at one of the tetrahedral sites previously shown as being occupied by a silicon atom in FIGS. 3 and 4. The PBU of the organic-framework zeolite 500 is indicated by unit 502. In this embodiment, "Si" represents tetrahedral sites where silicon atoms (or other tetravalent atoms) can reside, "Ge" represents a tetrahedral site where tetravalent atoms such as germanium can reside, and "CH2" and "O" represents lattice sites where the methylene (or other carbon-containing) groups and oxygen atoms, respectively, can reside.

While only two tetrahedral sites in the framework 500 are shown as being populated by germanium atoms, additional (or different) sites can also be populated. By incorporating germanium (or other tetravalent atoms, such as titanium (Ti) or manganese (Mn)) into the organic-framework zeolite lattice) changes may be made to, among other things, the dielectric constant and/or the modulus of elasticity of the ILD 108.

Tetrahedral site substitution is not necessarily limited to only tetravalent atoms. Combinations of non-tetravalent atoms, such as for example, a pentavalent atom (e.g., phosphorus, arsenic, antimony, etc.,) and a trivalent atom (aluminum, boron, gallium, etc.,) may occupy different tetrahedral sites in the organic-framework zeolite and thereby produce an ILD that has improved electrical properties and/or mechanical strength. More specifically, pentavalent atoms can be incorporated into tetrahedral sites of the organic-framework zeolites. Organic-framework zeolites that have tetrahedral sites occupied by only silicon atoms and pentavalent atoms, however, are electrically imbalanced. Therefore, trivalent atoms can additionally be incorporated within the lattice to occupy other tetrahedral sites so as to maintain electrical neutrality. While zeolite frameworks incorporating trivalent and pentavalent atoms may have higher dielectric constants than the aforementioned organic-framework zeolites (due to the increased polarizability of T-O bonds, especially for trivalent atoms), their mechanical strength may still be relatively high as compared to CDOs and/or their dielectric constants may still be relatively low as compared to $SiO_2$-based dielectrics.

A number of methods can be used to form organic-framework zeolites for use as ILDs. For example, they can be (1) in-situ crystallized (i.e. formed directly on the semiconductor substrate) by spinning onto the substrate the appropriate precursor(s) (and if necessary, an organic structure directing agent (SDA)) and then reacting the precursors to form the organic-framework zeolite followed by a solvent bake and/or calcination process; or (2) formed beforehand, suspended in a solution, and then spin-coated onto the substrate followed by a hard bake and/or a calcination process. In either case, calcination can be performed directly after the ILD has been deposited or after other processing steps (for example, after forming an interconnect in the ILD structure) have been completed.

With respect to the in-situ method, the organic-framework zeolite can be formed by using bis(triethoxysilyl)methane (BTESM) as the organic-framework zeolite precursor and triethylmethylammonium (TEMA) as an organic SDA. In-situ crystallization can alternatively occur by using a combination of tetraethoxysilane (TEOS) and BTESM precursors with a tetraethylammonium (TEA) SDA. Here, to the extent that a specific ratio of methylene groups to oxygen atoms in the organic-framework zeolite lattice is desired, the relative proportions of BTESM (methylene-containing precursor) to TEOS (oxygen-containing precursors) can be increased or decreased accordingly. However, note that formation of the organic-framework zeolites disclosed herein is not limited to being formed using TEOS, BTESM, TEMA and TEA. Any number of other precursors, and if necessary SDAs, can be used.

Inasmuch as tetravalent atoms (other than silicon) or pentavalent/trivalent atoms are to be incorporated into the organic-framework zeolite lattice, alternative precursors which contain the appropriate tetravalent or pentavalent/trivalent atoms can be used with the other organic-framework zeolite precursor(s) and SDA. Substitution of the tetravalent, pentavalent, and trivalent atoms in the tetrahedral site locations can be controlled by selecting the appropriate tetravalent atom precursor(s) or pentavalent and trivalent atom precursor(s) and then controllably combining it with the organic-framework zeolite precursor(s) and the SDA.

With respect to methods where organic-framework zeolite crystals are formed beforehand and then applied using a spin-on process, the initial precursor(s) (e.g., a methylene or carbon-containing precursor, an oxygen precursor, a silicon-oxygen precursor, a silicon-oxygen-methylene precursor, other tetravalent atom precursors, pentavalent/trivalent atom precursors, or some combination thereof) and an SDA (if necessary) can be put in an appropriate solution and reacted to form organic-framework zeolite nanocrystals. The organic-framework zeolite nanocrystals can then be removed from the solution via an ultracentrifugation process (or the like) and then put into a solvent solution. The organic-framework zeolite-containing solvent solution can then be spun onto the substrate followed by a bake to draw off solvents. Finally, if necessary, residual SDA can be removed via calcination. Calcination can be carried out directly after the ILD has been deposited or after other processing steps have been completed.

Turning now to FIGS. 6-9, an exemplary non-limiting embodiment is disclosed showing formation of a dual-damascene interconnect opening in the ILD 108. This embodiment is intended to show one aspect of how organic-framework zeolite ILDs can be beneficial. One of ordinary skill appreciates that this specific ILD implementation is but one example of how the organic framework zeolite can be used. And, that its use as an ILD (or dielectric) for other applications (e.g., as a passivation layer, for gap fill, as an etch-stop or barrier layer, for single damascene interconnects, or for dual damascene interconnects formed using other techniques, etc.,) may provide similar or other advantages.

Figure 6:
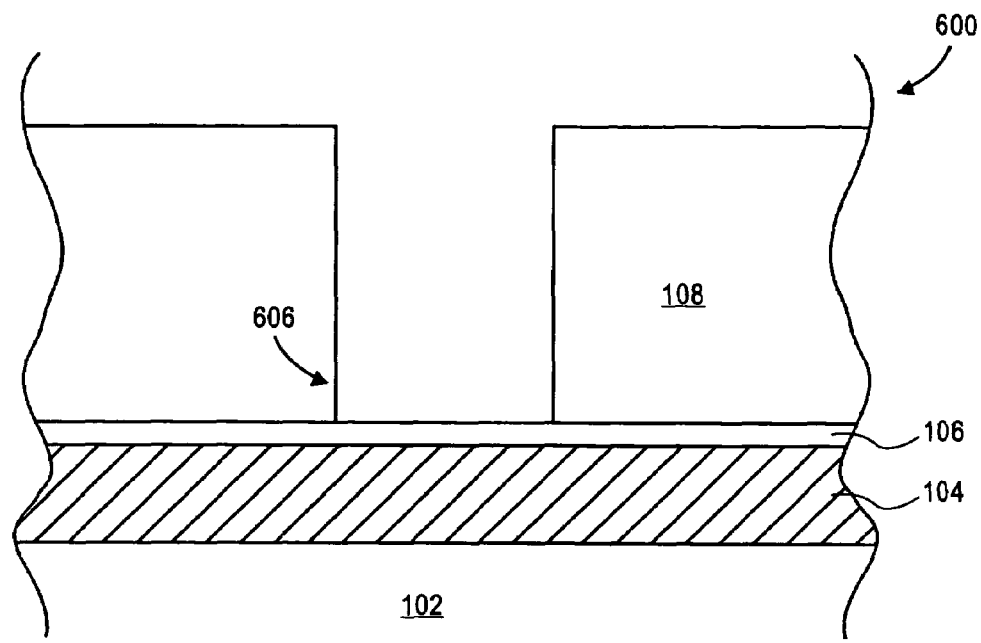
FIG. 6 illustrates the cross-sectional view of the partially fabricated semiconductor device shown in FIG. 1 after forming a via opening through the interlayer dielectric.

In FIG. 6, the partially fabricated semiconductor device of FIG. 1 is further illustrated after forming via opening 606 in the ILD 108. The ILD 108 is an organic-framework zeolite that has been formed using one or more of the embodiments disclosed herein. To the extent that the ILD 108 has properties similar to conventional SiO2, then resist patterning, ILD etching, and resist removal can all be accomplished using conventional processes. As shown in FIG. 6, etching to form via opening 606 typically terminates on or in the etch stop layer 106 (or on the underlying conductive layer in the absence of the etch stop layer).

Figure 7:
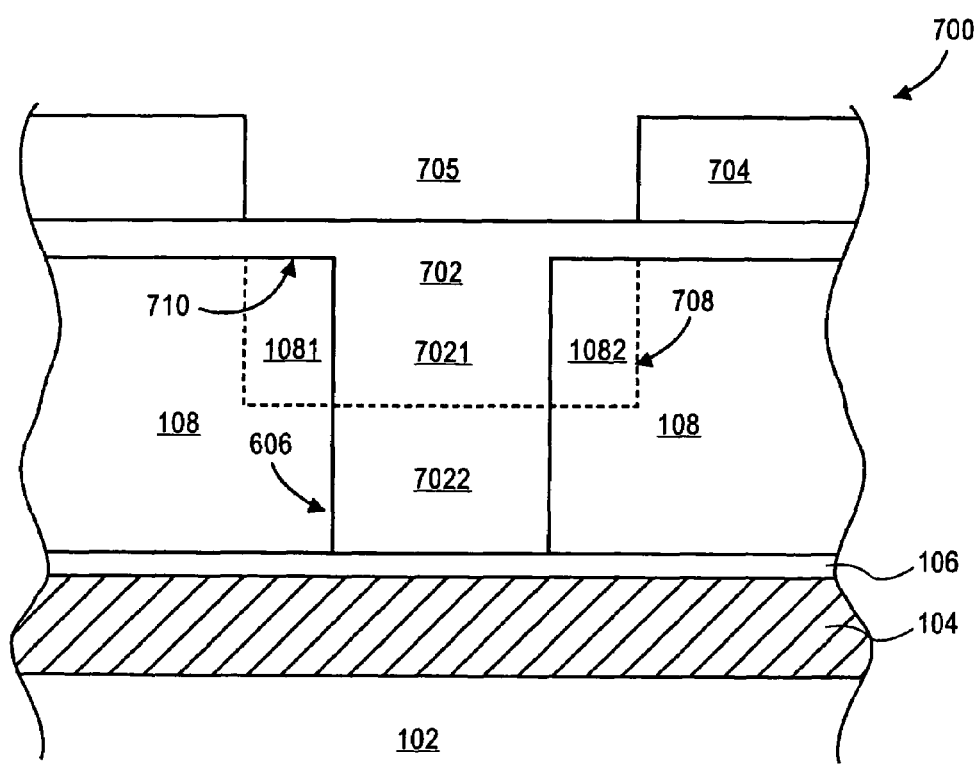
FIG. 7 illustrates the cross-sectional view of the partially fabricated semiconductor device shown in FIG. 6 after depositing an anti-reflective layer and patterning a resist layer.

Turning now to FIG. 7, a cross-sectional view 700 of the partially fabricated semiconductor device of FIG. 6 is shown after an antireflective/fill material 702 is formed over ILD 108 and within via opening 606. The antireflective/fill material 702 (known alternatively as a bottom-antireflective coating (BARC) or a sacrificial light absorbing material (SLAM)) preferably (but not necessarily) (1) has a high optical absorption at the exposure wavelength used during lithography process to define the trench patterns, (2) uniformly fills the via opening 606 and has an etch rate that is comparable to the ILD 108 etch rate, (3) has good selectivity to the photoresist 704 during the trench etch process, and (4) is compatible with the trench lithographic process (i.e., the trench photoresist coat, patterning, developing, or cleaning processes).

A resist layer 704 has been deposited overlying antireflective/fill material 702. The resist layer 704 has been patterned to form a resist opening 705 that exposes portions of antireflective/fill material 702. Portions of antireflective/fill material 702 exposed by the resist opening 705 can then be removed using, for example, a plasma etch process. Initially, the etch removes only antireflective/fill material 702 exposed by the opening 504. Upon reaching the upper surface 710 of the ILD 108, ILD portions 1081, 1082, and via portions 7021 are etched until a trench opening (here approximated by the dashed line 708) is formed. After forming the trench opening 708, resist layer 704 can be removed using conventional ash or wet clean processes.

After the resist 704 is removed, the substrate is typically cleaned again to remove unremoved portions 7022 of anti antireflective/fill material 702. Normally, this clean is performed using hydrofluoric (HF) acid-based or other similar fluoride-containing solutions. With prior art $SiO_2$-based ILDs, the use of HF (and/or other solutions) at this point was traditionally a concern because it could attack and damage the ILD. However, using one or more of the organic-framework zeolite embodiments disclosed herein, this concern is mitigated. That is, the presence of carbon-based groups in the organic-framework zeolite makes the dielectric 108 less susceptible to HF induced deterioration during cleaning and other post ILD 108 deposition processes.

Figure 8:
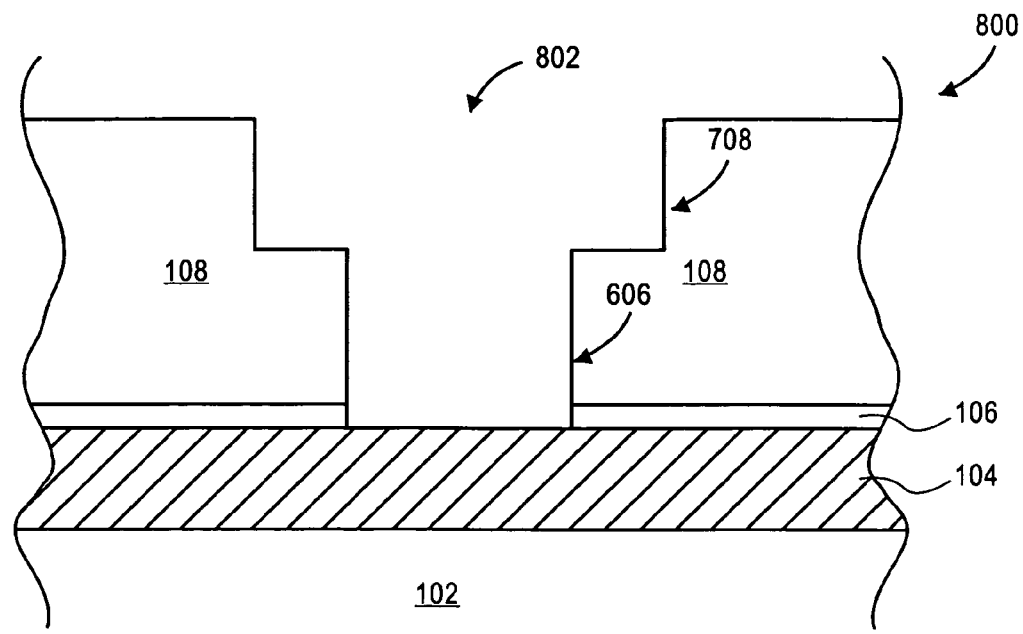
FIG. 8 illustrates the cross-sectional view of the partially fabricated semiconductor device shown in FIG. 7 after forming a dual damascene opening in the interlayer dielectric.

Turning now to FIG. 8, a cross-sectional view 800 of the partially fabricated semiconductor device of FIG. 7 is shown after the remaining portions 7022 of the antireflective-fill material (shown in FIG. 7) have been removed and underlying portions of the optional ESL 106 have been removed. As stated previously, the remaining portions 7022 of the antireflective-fill material can be removed using an HF solution or the like. The ESL 106 can be removed using a conventional plasma etch process and exposed conductive material 104 can then be cleaned using conventional processing. At this point, as shown in FIG. 8, a dual-damascene opening 802 that includes a via portion 606 and a trench portion 708 has been formed in the ILD 108.

Figure 9:
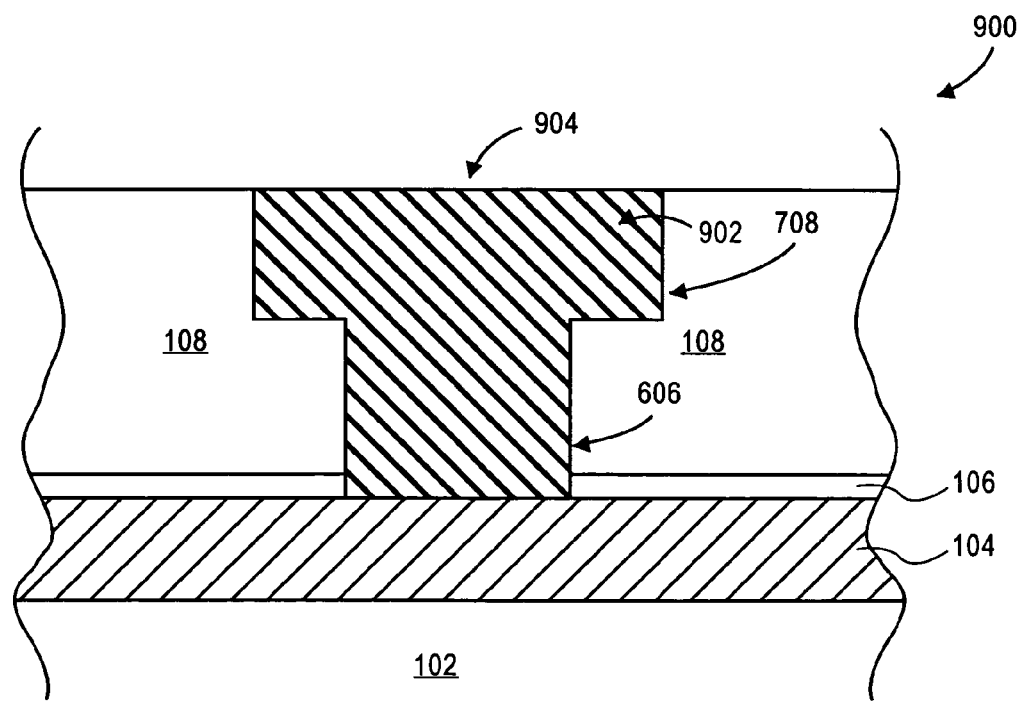
FIG. 9 illustrates the cross-sectional view of the partially fabricated semiconductor device shown in FIG. 8 after forming an interconnect structure in the dual damascene opening.

Turning now to FIG. 9, a cross-sectional view 900 of the partially fabricated semiconductor device of FIG. 8 is shown after a conductive material 902 has been deposited in trench 708 and via 606 to form a dual-damascene interconnect 904. Here, the dual-damascene interconnect 904 includes conductive material 902. The conductive material 902 can include: (1) barrier layers, such as tantalum nitride (TaN), titanium nitride (TiN), titanium tungsten (Ti/W), composites thereof, or the like; (2) seed layers that comprise copper, metallic, or copper-alloy seed materials; and (3) bulk conductive materials, that can include copper, aluminum, or alloys of copper or aluminum, or the like. Typically a combination of barrier, seed, and bulk conductive materials fill the dual-damascene opening. Excess conductive fill material can be removed using chemical-mechanical-planarization to form the dual-damascene structure shown in FIG. 9. Because the ILD 108 now comprises an organic-framework zeolite that has a relatively high modulus of elasticity as compared to CDOs (or spin-on polymers), problems related to CMP induced damage may be reduced.

Processing thereafter is considered conventional to one of ordinary skill in the art. Additional layers of interconnects, ILDS, bond pad structures, etc., may be formed to fabricate a semiconductor device. Again, because the ILD 108 is mechanically stronger than that of a prior art CDO or spin-on polymer, reduced tooling and process changes may now be necessitated at various subsequent processing stages (e.g., die singulation, wafer probe, wire bond, die attach, etc.) thereby reducing overall cost and reliability of the semiconductor device.

In the various embodiments discussed herein organic-framework zeolites having partially and fully substituted carbon-containing groups have been disclosed. The presence of the carbon improves the zeolites resistance to chemical attack. And, it can also reduce the material's dielectric constant. Because the organic-framework zeolite has a higher modulus of elasticity than prior art carbon-doped oxides, it can better withstand exposure to higher compressive, tensile, and sheer forces produced during subsequent processes. Trivalent, tetravalent (other than silicon), and pentavalent atoms incorporated into the organic-framework zeolite's lattice may further improve the mechanical properties and/or dielectric constant of the zeolite. Zeolites incorporating one or more of the embodiments disclosed herein may be used as an ILD or other dielectric layer for semiconductor devices.

Having thus described in detail embodiments of the present invention it is understood that the invention defined by the appended claims is not to be limited by particular details set forth in the above description, as many apparent variations thereof are possible without departing from the spirit or scope thereof.

What is claimed is:

1. An interlayer dielectric comprising an organic-framework zeolite, wherein:
   a lattice of the organic framework zeolite includes a carbon-containing group; and
   wherein at least one tetrahedral site in the organic-framework zeolite includes a tetravalent atom selected from a group consisting of germanium, titanium, and manganese.

2. The interlayer dielectric of claim 1, wherein the organic-framework zeolite includes a carbon-containing group in a primary building unit of the organic-framework zeolite.

3. The interlayer dielectric of claim 1, wherein the organic-framework zeolite includes a carbon-containing group in a secondary building unit of the organic-framework zeolite.

4. The interlayer dielectric of claim 1, wherein the organic-framework zeolite includes more than one carbon-containing group in a primary building unit of the organic-framework zeolite.

5. The interlayer dielectric of claim 1, wherein the tetrahedral site resides in a secondary building unit of the organic-framework zeolite.

6. An interlayer dielectric comprising an organic-framework zeolite, wherein:
   a lattice of the organic framework zeolite includes a carbon-containing group; and
   at least a first tetrahedral site in the organic-framework zeolite includes a pentavalent atom, and wherein at least a second tetrahedral site in the organic-framework zeolite includes a trivalent atom.

7. The interlayer dielectric of claim 6, wherein the pentavalent atom includes an atom selected from the group consisting of phosphorus, arsenic, and antimony.

8. The interlayer dielectric of claim 6, wherein the trivalent atom includes an atom selected from the group consisting of boron, aluminum, and gallium.

9. A semiconductor device comprising a dielectric layer that includes an organic-framework zeolite, wherein the organic framework zeolite includes silicon, oxygen, and carbon in a primary building unit, and further comprising a tetravalent atom selected from the group consisting of germanium, titanium, and manganese in at least one tetrahedral site in a secondary building unit of the organic framework zeolite material.

10. The semiconductor device of claim 9, wherein a ratio of carbon-to-oxygen in the primary building unit is greater than one-to-one.

11. A semiconductor device comprising:
   a dielectric layer that includes an organic-framework zeolite, wherein the organic framework zeolite includes silicon, oxygen, and carbon in a primary building unit;
   a pentavalent atom selected from the group consisting of phosphorus, arsenic, and antimony at one tetrahedral site in a secondary building unit of the organic-framework zeolite material; and
   a trivalent atom selected from the group consisting of boron, aluminum, and gallium at another tetrahedral site in the secondary building unit.

* * * * *